US008547271B2

(12) United States Patent
De Geronimo et al.

(10) Patent No.: US 8,547,271 B2
(45) Date of Patent: Oct. 1, 2013

(54) METHOD AND APPARATUS FOR LOW POWER ANALOG-TO-DIGITAL CONVERSION

(75) Inventors: Gianluigi De Geronimo, Syosset, NY (US); Neena Nambiar, Ridge, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 0 days.

(21) Appl. No.: 13/474,060

(22) Filed: May 17, 2012

(65) Prior Publication Data

US 2012/0293351 A1 Nov. 22, 2012

Related U.S. Application Data

(60) Provisional application No. 61/488,499, filed on May 20, 2011.

(51) Int. Cl.
*H03M 1/38* (2006.01)
(52) U.S. Cl.
USPC ............ 341/161; 341/122; 341/155; 341/172
(58) Field of Classification Search
USPC .......................................... 341/122, 155, 161
See application file for complete search history.

(56) References Cited

U.S. PATENT DOCUMENTS

| | | | | |
|---|---|---|---|---|
| 5,963,158 A | * | 10/1999 | Yasuda | 341/136 |
| 7,187,316 B1 | * | 3/2007 | DeGeronimo | 341/155 |
| 7,388,608 B2 | * | 6/2008 | Beck et al. | 348/243 |
| 7,714,762 B2 | * | 5/2010 | Poon et al. | 341/161 |

FOREIGN PATENT DOCUMENTS

WO PCT/US2012/038641  8/2012

OTHER PUBLICATIONS

Andersen, T., et al., "A Cost-Efficient High-Speed 12-bit Pipeline ADC in 0.18-μm Digital CMOS," *IEEE Journal of Solid-State Circuits*, vol. 40, No. 7, pp. 1506-1513, 2005.
Brooks, L. et al., "A 12b, 50 MS/s Fully Differential Zero-Crossing Based Pipelined ADC," *IEEE Journal of Solid State Circuits*, vol. 44, No. 12, pp. 3329-3343, 2009.
Chung, Y., et al., "A CMOS 6-mW 10-bit 100-MS/s Two-Step ADC," *IEEE Journal of Solid State Circuits*, vol. 45, No. 11, pp. 2217-2226, 2010.
Davidovich, M., et al., "A 12-bit Fully Differential 2MS/s Successive Approximation Analog-to-Digital Converter with Reduced Power Consumption," 13th Annual International Symposium on Design and Diagnostics of Electronic Circuits and Systems (DDECS), pp. 399-402, (Vienna, Apr. 14-16, 2010) [online] [retrieved Apr. 30, 2013 from: <URL: http://ieeexplore.ieee.org/xpls/abs_all.jsp?arnumber=5491744>].

(Continued)

*Primary Examiner* — Khai M Nguyen
(74) *Attorney, Agent, or Firm* — Dorene M. Price

(57) ABSTRACT

A method and apparatus for analog-to-digital conversion. An Analog-to-Digital Converter (ADC) includes M $ADC_j$, j=1, 2, ..., M. Each $ADC_j$ comprises a number of cells each of which comprises a first switch, a second switch, a current sink and an inverter. An inverter of a cell in an $ADC_j$ changes state in response to a current associate with an input signal of the $ADC_j$ exceeding a threshold, thus switching on the next cell. Each $ADC_j$ is enabled to perform analog-to-digital conversion on a residual current of a previous $ADC_{j-1}$ after the previous $ADC_{j-1}$ has completed its analog-to-digital conversion and has been disabled.

21 Claims, 13 Drawing Sheets

(56) References Cited

OTHER PUBLICATIONS

Elzakker, M., et al., "A 10-bit Charge-Redistribution ADC Consuming 1.9 μW at 1 MS/s," *IEEE Journal of Solid-State Circuits*, vol. 45, No. 5, pp. 1007-1015, 2010.

Esperança, B., et al., "Power-and-Area Efficient 14-bit 1.5 MSample/s Two-Stage Algorithmic ADC Based on a Mismatch-Insensitive MDAC," IEEE International Symposium on Circuits and Systems, pp. 220-223 (Seattle, May 18-21, 2008) [online] [retrieved Apr. 30, 2013 from: <URL: http://ieeexplore.ieee.org/stamp/stamp.jsp?tp=84arnumber=4541394>].

Kim, M., et al., "A 10 MS/s 11-bit 0.19mm$^2$ Algorithmic ADC with Improved Clocking Scheme," *IEEE Journal of Solid-State Circuits*, vol. 44, No. 9, pp. 2348-2355, 2009.

Lee, J., et al., "A 2.5 mW 80 dB DR 36 dB SNDR 22 MS/s Logarithmic Pipeline ADC," *IEEE Journal of Solid-State Circuits*, vol. 44, No. 10, pp. 2755-2765, 2009.

Liu, C., et al., "A 10-bit 50-MS/s SAR ADC With a Monotonic Capacitor Switching Procedure," *IEEE Journal of Solid-State Circuits*, vol. 45, No. 4, pp. 731-740, 2010.

Otfinowski, P., et al., "A 2.5MS/s 225 μW 8-bit Charge Redistribution SAR ADC for Multichannel Applications," Proceedings of the 17$^{th}$ International Conference of Mixed Design of Integrated Circuits and Systems (MIXDES), pp. 182-185, (Wroclaw, Jun. 24-26, 2010).

Peach, C., et al., "An 11.1 mW 42 MS/s 10 b ADC With Two-Step Settling in 0.18 μm CMOS," *IEEE Journal of Solid-State Circuits*, vol. 45, No. 2, pp. 391-400, 2010.

Rarbi, F., et al., "A Low Power 12-bit and 25-MS/s Pipelined ADC for the ILC/Ecal Integrated Readout," 2008 IEEE Nuclear Science Symposium Conference Record, pp. 1506-1511, (Oct. 19-25, 2008) [online] [retrieved Apr. 30, 2013 from: <URL: http://ieeexplore.ieee.org/xpls/abs_all.jsp?arnumber=4774699>].

Walden, R., "Analog-to-Digital Converter Survey and Analysis," *IEEE Journal on Selected Areas in Communications*, vol. 17, No. 4, pp. 539-550, 1999.

\* cited by examiner

METHOD AND APPARATUS FOR LOW POWER ANALOG-TO-DIGITAL CONVERSION

CROSS-REFERENCE TO RELATED APPLICATIONS

This application claims the benefit under 35 U.S.C. 119(e) of U.S. Provisional Application No. 61/488,499 filed on May 20, 2011, the disclosure of which is incorporated in this application in its entirety.

STATEMENT OF GOVERNMENT LICENSE RIGHTS

The present invention was made with government support under contract number DE-AC02-98CH10886, awarded by the U.S. Department of Energy. The Government has certain rights in this invention.

I. FIELD OF THE INVENTION

The present invention relates to analog-to-digital conversion, and more particularly to a method and apparatus for low power analog-to-digital conversion.

II. BACKGROUND

Analog-to-Digital conversion (A-D conversion) is required whenever real world signals that are analog are to be processed and analyzed by a computer. Multi-channel A-D conversions are required in many industrial, medical and measurement applications. Low power consumption is required on systems which involve, a large number of channels, and the upper limit for these systems may be a few milliwatts. In addition, for battery-operated systems, a low power A-D conversion is required for longer battery life.

FIG. 1 shows an example application of an Analog-to-Digital Converter (ADC). The input to the ADC is an analog shaped pulse. The ADC digitizes this pulse and provides a 12-bit digital output. The minimum sampling rate of an ADC is set by the bandwidth of an input signal. Following Nyquist criteria, the minimum sampling rate of the ADC should be twice the maximum frequency of the input signal. For applications such as radiation detection systems, the frequency of the events and the pulse width at the output of the filter (shaper) define the sampling rate. The shaper output has typically a peaking time of a fraction of microseconds. This implies that a sampling rate of a few Megasamples per second (Msps) is typically needed for these applications.

ADC resolution is another important parameter which defines the minimum change in the analog input that can be discriminated by the ADC. For a moderate-high resolution, 10 to 12 bit ADCs are typically required. Finally, the requirement on the clock, e.g., lowest possible clock frequency, and the available chip area are other factors contributing to the selection of the ADC topology.

It is preferred to have a low power 12-bit ADC for supporting multi-channel applications. It is also preferred to have an ADC that has the capability of supporting a sampling rate of a few Msps with minimum requirement on the clock and while occupying a relatively small area.

A few topologies of ADCs can be found in the literature that approach these specifications. For moderate-high resolution and the sampling rate of a few Msps, these architectures include Pipeline and Successive Approximation Register.

The Successive Approximation Register (SAR) ADC consists of a comparator, a Digital-to-Analog Converter (DAC) and a register. An input signal is successively compared to the voltage generated by the DAC and each bit in the register is set to '1' or '0' depending on the result of the comparison. A disadvantage of the SAR ADC is that for a N bit resolution, it requires N clock cycles and hence a fast clock. Additionally, the SAR ADC requires the DAC and the comparator to be 12-bit accurate, which implies higher power consumption. A SAR ADC is described in Davidovic, M.; Zach, G.; Zimmermann, H.; "A 12-bit fully differential 2 MS/s successive approximation analog-to-digital converter with reduced power consumption," Design and Diagnostics of Electronic Circuits and Systems (DDECS), 2010 IEEE 13th International Symposium, pp. 399-402, 14-16 Apr. 2010, which meets the requirement of 12-bit and 2 Msps, but has a relatively high power consumption of 10 mW and an area of 1.1 $mm^2$, and which is incorporated by reference in its entirety as if fully set forth in this specification.

Charge redistribution SAR ADC is another candidate that may match the required specifications. However, this topology of ADC requires large capacitors. The linearity of the ADC depends on the matching between the capacitors. A charge redistribution SAR ADC is described in Otfinowski, P., "A 2.5 MS/s 225 p.W 8-bit charge redistribution SAR ADC for multichannel applications," Mixed Design of Integrated Circuits and Systems (MIXDES), 2010 Proceedings of the 17th International Conference, pp. 182-185, 24-26 Jun. 2010, which is incorporated by reference in its entirety as if fully set forth in this specification. But the redistribution SAR ADC has a resolution limited to 8 bits.

The pipeline ADC consists of a lower resolution DAC and ADC and multiple stages of flash ADCs. A major drawback of pipeline ADCs is the power consumption. A pipeline ADC is described in Rarbi, Fatah; Dzahini, Daniel; Gallin-Martel, Laurent, "A low power 12-bit and 25-MS/s pipelined ADC for the ILC/ECAL integrated readout," Nuclear Science Symposium Conference Record, 2008. NSS '08. IEEE, pp. 1506-1511, 19-25 Oct. 2008, which supports a high sampling rate, but has a high power consumption of 42 mW, and which is incorporated by reference in its entirety as if fully set forth in this specification. Some of the more recent ADCs are included in Table 1 below along with their sampling rates and power consumption.

Figures of Merit (FOM) are frequently used to compare the performance of ADCs. A typical FOM is given in Walden, R. H., "Analog-to-digital converter survey and analysis," Selected Areas in Communications, IEEE Journal of Selected Areas Communications, vol. 17, no. 4, pp. 539-550, April 1999, which is incorporated by reference in its entirety as if fully set forth in this specification, and in which the FOM is represented by:

$$FOM = 2^b * f_s / P_{diss}$$

where, b is the resolution, $f_s$, is the sampling frequency and $P_{diss}$ is the power dissipated. Table 1 compares a few ADCs from recent years with respect to resolution, power, sampling rate, area and FOM. The Pipeline ADC listed in the first row of Table 1 was described in Peach, C. T.; Un-Ku Moon; Alistot, D. J., "An 11.1 mW 42 MS/s 10 b ADC With Two-Step Settling in 0.18 μm CMOS," Solid-State Circuits, IEEE Journal of Solid State Circuits, vol. 45, no. 2, pp. 391-400, February 2010, which is incorporated by reference in its entirety as if fully set forth in this specification.

The Logarithmic Pipeline ADC listed in the second row of Table 1 was described in Jongwoo Lee; Kang, J.; Sunghyun Park; Jae-sun Seo; Anders, J.; Guilherme, J.; Flynn, M. P., "A 2.5 mW 80 dB DR 36 dB SNDR 22 MS/s Logarithmic Pipeline ADC," Solid-State Circuits, IEEE Journal of Solid State Circuits, vol. 44, no. 10, pp. 2755-2'765, October 2009, which is incorporated by reference in its entirety as if fully set forth in this specification.

The Charge Redistribution SAR ADC in Table 1 was described in van Elzakker, M.; van Tuijl, E.; Geraedts, P.; Schinkel, D.; Klumperink, E.; Nauta, B., "A 10-bit Charge-Redistribution ADC Consuming 1.9 µW at 1 MS/s," Solid-State Circuits, IEEE Journal of Solid State Circuits, vol. 45, no. 5, pp. 1007-1015, May 2010, which is incorporated by reference in its entirety as if fully set forth in this specification.

The Two Step ADC in the fourth row of Table 1 was described in Yung-Hui Chung; Jieh-Tsorng Wu, "A CMOS 6-mW 10-bit 100-MS/s Two-Step ADC," Solid-State Circuits, IEEE Journal of Solid State Circuits, vol. 45, no. 11, pp. 2217-2226, November 2010, which is incorporated by reference in its entirety as if fully set forth in this specification.

The Algorithmic ADC in the fifth row of Table 1 was described in Min Gyu Kim; Hanumolu, P. K.; Un-Ku Moon, "A 10 MS/s 11-bit 0.19 mm2 Algorithmic ADC With Improved Clocking Scheme," Solid-State Circuits, IEEE Journal of Solid State Circuits, vol. 44, no. 9, pp. 2348-2355, September 2009, which is incorporated by reference in its entirety as if fully set forth in this specification.

The Zero-Crossing based Pipeline ADC in row 6 of Table 1 was described in Brooks, L.; Hae-Seung Lee, "A 12b, 50 MS/s, Fully Differential Zero-Crossing Based Pipelined ADC," Solid-State Circuits, IEEE Journal of Solid State Circuits, vol. 44, no. 12, pp. 3329-3343, December 2009, which is incorporated by reference in its entirety as if fully set forth in this specification.

The SAR ADC in Table 1 was described in Chun-Cheng Liu; Soon-Jyh Chang; Guan-Ying Huang; Ying-Zu Lin, "A 10-bit 50-MS/s SAR ADC With a Monotonic Capacitor Switching Procedure," Solid-State Circuits, IEEE Journal of Solid State Circuits, vol. 45, no. 4, pp. 731-740, April 2010, which is incorporated by reference in its entirety as if fully set forth in this specification.

The Pipeline ADC in row 8 of Table 1 was described in Andersen, T. N.; Hernes, B.; Briskemyr, A.; Telsto, F.; Bjornsen, J.; Bonnerud, T. E.; Moldsvor, O., "A cost-efficient high-speed 12-bit pipeline ADC in 0.18-vm digital CMOS," Solid-State Circuits, IEEE Journal of Solid-State Circuits, vol. 40, no. 7, pp. 1506-1513, July 2005, which is incorporated by reference in its entirety as if fully set forth in this specification.

The Algorithmic ADC in row 9 of Table 1 was described in Esperanca, B.; Goes, J.; Tavares, R.; Galhardo, A.; Paulino, N.; Silva, M. M., "Power-and-area efficient 14-bit 1.5 MSample/s two-stage algorithmic ADC based on a mismatch-insensitive MDAC," Circuits and Systems, 2008. 1SCAS 2008. IEEE International Symposium, pp. 220-223, 18-21 May 2008, which is incorporated by reference in its entirety as if fully set forth in this specification.

It can be seen from Table 1 that most of the ADCs do not achieve the required resolution when the Effective Number Of Bits (ENOB) is measured. ENOB of the ADC is calculated from the Signal to Noise Ratio (SNR). The higher the SNR, the higher the ENOB. Accordingly, if a higher resolution is needed, more power will be consumed. In addition, architectures like the SAR ADC require a high speed clock that is dictated by the sampling frequency and the resolution.

TABLE 1

| Number | Architecture | Res (bits) | ENOB | Samp Rate (Msps) | Power (mW) | Area (mm2) | Clock (MHz) | FOM | Tech (nm) |
|---|---|---|---|---|---|---|---|---|---|
| 1 | Pipeline | 10 | 8.94 | 42 | 11.1 | 1.2 | ~42 | 3.87e12 | 180 |
| 2 | Logarithmic Pipeline | 8 | 5.62 | 22 | 2.5 | 0.56 | ~22 | 2.25e12 | 180 |
| 3 | Charge Redistribution SAR | 10 | 8.75 | 1 | 0.0019 | 0.025 | ~10 | 5.38e14 | 65 |
| 4 | Two Step | 10 | 9.34 | 100 | 6 | 0.36 | ~200 | 1.70e13 | 90 |
| 5 | Algorithmic | 11 | 9 | 10 | 15 | 0.19 | ~100 | 1.36e12 | 130 |
| 6 | Zero-Crossing based Pipeline | 12 | 10 | 50 | 4.5 | 0.3 | ~50 | 4.50e13 | 90 |
| 7 | SAR ADC | 10 | 9.18 | 50 | 0.826 | 0.0517 | ~500 | 6.19e13 | 130 |
| 8 | Pipeline | 12 | 10 | 2 | 10 | 0.86 | ~2 | 8.19e11 | 180 |
| 9 | Algorithmic | 14 | 12 | 1.54 | 10 | 0.36 | ~10 | 2.54e12 | 130 |

U.S. Pat. No. 7,187,316 to Gianluigi De Geronimo, which is incorporated by reference in its entirety as if fully set forth in this specification, discloses an ADC that provides peak detection and A-D conversion of shaped analog pulses caused by an ionizing event in a radiation detection system without requiring a clock signal and using very little power. The A-D conversion occurs during a rising edge of a shaped pulse and conversion is complete when the peak occurs. However, the ADC in this U.S. patent is unable to provide a 12-bit resolution at the given speed.

In view of these and other considerations, there is a need to develop an analog-to-digital converter that is capable of meeting the requirements of lower power dissipation, smaller area, sampling rate capability of a few Msps, a 12-bit resolution, and lower requirement on the clock.

SUMMARY

An analog-to-digital converter is provided including a first section including n cells, and a second section including n cells, in which n is an integer. The first section is coupled to the second section through at least one transistor. Each of the n cells in the first and the second sections includes a first switch, a second switch, a current sink, and an inverter. The first switch includes a first end that is operatively coupled to an input signal of the corresponding section and a second end. The second switch includes a first end and a second end operatively coupled to the second end of the first switch. The current sink is operatively coupled to the second end of the first switch, and the current sink is supplied by a current source. The inverter includes an input terminal operatively coupled to the second end of the first switch and the second end of the second switch and an output terminal.

In the first section and the second section, respectively, the first switch of a first cell is closed; the first switches of a $2^{nd}$ to $n^{th}$ cells are open; and the second switches of the n cells are closed.

The inverter of a $k^{th}$ cell, k=1, 2, 3, ..., n, in the first section and the second section, respectively, changes state if the current associated with the input signal of the corresponding section is higher than a threshold determined by the current associated with the k current sinks of the $1^{st}$ to $k^{th}$ cells. The second switch of the $k^{th}$ cell is open in response to the changing state of the inverter of the $k^{th}$ cell. The first switch of a $(k+1)^{th}$ cell is closed in response to the changing state of the inverter of the $k^{th}$ cell if k is less than n. The threshold may further be determined by the sum of the current associated with the k current sinks of the $1^{st}$ to $k^{th}$ cells. The current associated with the input signal of the second section is the residual current from the first section that is represented by $I_{R1}=I_{R0}-i_{n1}*n_{c1}$ where $I_{R0}$ is the current associated with the input signal of the first section, $n_{c1}$ is the number of cells in the first section that are switched on, and $i_{n1}$ is the current carried by the current source in a single cell in the first section.

The analog-to-digital converter further includes a transient absorbing circuit. The transient absorbing circuit absorbs a part of the current associated with the input signal of the second section, and releases the part of the current after a predetermined amount of time. The transient absorbing circuit may further include a transistor for absorbing current, and a Schmitt trigger, wherein current absorbed by the transistor is released if the Schmitt trigger changes state.

The analog-to-digital converter may further include a sample and hold circuit. The sample and hold circuit includes a first amplifier having a positive terminal and a negative terminal and a second amplifier having a positive terminal and a negative terminal. The sample and hold circuit also includes a first switched capacitor coupled to the negative terminal of the first amplifier and a second switched capacitor coupled to the negative terminal of the second amplifier. When the first amplifier is operated to charge the first switched capacitor to an input voltage value, the second amplifier transfers the voltage across the first switched capacitor or the second switched capacitor to a load. When the second amplifier is operated to charge the second switched capacitor to the input voltage value, the first amplifier transfers the voltage across the first switched capacitor to the load.

Further provided is an analog-to-digital converter including a first section and a second section. The first section is coupled to the second section through at least one transistor. Each of the first and second sections includes a first cell. The first cell includes a first switch, a second switch, a first current sink, and a first inverter. The first switch includes a first end operatively coupled to an input signal of the corresponding section and a second end. The second switch includes a first end and a second end which is operatively coupled to the second end of the first switch. The first current sink is operatively coupled to the second end of the first switch, and the first current sink is supplied by a first current source. The first inverter includes an input terminal that is operatively coupled to the second end of the first switch and the second end of the second switch and an output terminal. In the first section and the second section, respectively, the first switch and the second switch of the first cell are closed. The first inverter changes state if the current associated with the input signal of the corresponding section is higher than a first threshold determined by the current associated with the first current sink, and the second switch is open in response to the changing state of the first inverter.

The first section and the second section, respectively, in the analog-to-digital converter may further include a second cell. The second cell includes a third switch, a fourth switch, a second current sink and a second inverter. The third switch includes a first end operatively coupled to the input signal of the corresponding section and a second end. The fourth switch includes a first end and a second end that is operatively coupled to the second end of the third switch. The second current sink is operatively coupled to the second end of the third switch, and the second current sink is supplied by a second current source. The second inverter includes an input terminal and an output terminal, and the input terminal is operatively coupled to the second end of the third switch and the second end of the fourth switch. In the first section and the second section, respectively, the fourth switch is closed, and the third switch is closed if the first inverter changes state. The second inverter changes state if the current associated with the input signal of the corresponding section is higher than a second threshold determined by the current associated with the first current sink and the second current sink, and the fourth switch is open in response to the changing state of the second inverter.

Further provided is an analog-to-digital converter including M Analog-to-Digital Converters (ADCs) $ADC_j$, j=1, 2, ..., M, where M is an integer and greater than 1. An $ADC_j$, j=1, 2, ..., M, includes $n_j$ cells each of which includes a first switch, a second switch, a current sink and an inverter. The first switch includes a first end operatively coupled to an input signal of the $ADC_j$, j=1, 2, ..., M, and a second end. The second switch includes a first end and a second end that is operatively coupled to the second end of the first switch. The current sink is operatively coupled to the second end of the first switch, and the current sink is supplied by a current source. The inverter includes an input terminal that is operatively coupled to the second end of the first switch and the second end of the second switch and an output terminal.

An $ADC_j$, j=2, 3, ..., M, is enabled to perform analog-to-digital conversion on a residual current of $ADC_{j-1}$ after $ADC_{j-1}$ has completed its analog-to-digital conversion and has been disabled. The residual current of $ADC_{j-1}$ is represented by $I_{R(j-1)}=I_{R(j-2)}-i_{n(j-1)}*n_{c(j-1)}$, where $I_{R0}$ is the current associated with the input signal of $ADC_1$, $n_{c(j-1)}$ is the number of cells in $ADC_{j-1}$ that are switched on, and $i_{n(j-1)}$ is the current carried by the current source in a single cell in $ADC_{j-1}$.

When an $ADC_j$, j=1, 2, 3, ..., M, is enabled, the first switch of the first cell is closed, the first switches of the $2^{nd}$ to $n_j^{th}$ cells are open, and the second switches of the $n_j$ cells are closed. The inverter of a $k^{th}$ cell, k=1, 2, 3, ..., in $ADC_j$ changes state if the current associated with the input signal of $ADC_j$ is higher than a threshold determined by the current associated with the k current sinks of the $1^{st}$ to $k^{th}$ cells in $ADC_j$. The second switch of the $k^{th}$ cell is open in response to the changing state of the inverter of the $k^{th}$ cell, and the first switch of a $(k+1)^{th}$ cell is closed in response to the changing state of the inverter of the $k^{th}$ cell if k is less than $n_j$.

The analog-to-digital converter may further include a transient absorbing circuit for at least one of the (M−1) $ADC_j$, j=2, 3, ... M, in which the transient absorbing circuit of an $ADC_j$ absorbs a part of the current associated with the input signal of the $ADC_j$, and releases the part of the current after a predetermined period of time.

A method for providing analog-to-digital conversion for an input signal by M Analog-to-Digital Converters (ADCs) $ADC_j$, j=1, 2, ..., M, is also provided, where M is an integer and greater than 1. An $ADC_j$, j=1, 2, ..., M, includes $n_j$ cells each of which includes a first switch, a second switch, a current sink supplied by a current source, and an inverter. The method includes performing analog-to-digital conversion by $ADC_1$ on a current I associated with the input signal; and disabling $ADC_1$ after the analog-to-digital conversion has been completed by the $ADC_1$ and maintaining the analog-to-digital conversion result of $ADC_1$.

The method also includes performing the steps a) and b) by $ADC_j$, j=2, 3, ..., M: a) performing analog-to-digital conversion by $ADC_j$ on the residual current of $ADC_{j-1}$. The residual current of $ADC_{j-1}$ is represented by $I_{R(j-1)} = I_{R(j-2)} - i_{n(j-1)} * n_{c(j-1)}$, where $I_{R0} = I$, $n_{c(j-1)}$ is the number of cells in $ADC_{j-1}$ that are switched on, and $i_{n(j-1)}$ is the current carried by the current source in a single cell in $ADC_{j-1}$; and b) disabling $ADC_j$ after the analog-to-digital conversion has been completed by the $ADC_j$ and maintaining the analog-to-digital conversion result of $ADC_j$.

The method also includes generating a binary value of the current I associated with the input signal using the analog-to-digital conversion results of the M $ADC_j$, j=1, 2, ..., M.

The method may further include enabling a sample and hold circuit. The method may further include enabling a transient absorbing circuit for at least one of the (M-1) $ADC_j$, j=2, 3, ... M. In such arrangement the transient absorbing circuit of an $ADC_j$ absorbs a part of the current on which analog-to-digital conversion is to be performed by the $ADC_j$, and releases the part of the current after a predetermined amount of time.

A sample and hold circuit is further provided. The sample and hold circuit includes a first amplifier having a positive terminal and a negative terminal and a second amplifier having a positive terminal and a negative terminal. The sample and hold circuit further includes a first switched capacitor coupled to the negative terminal of the first amplifier and a second switched capacitor coupled to the negative terminal of the second amplifier. When the first amplifier is operated to charge the first switched capacitor to an input voltage value, the second amplifier transfers the voltage across the first switched capacitor or the second switched capacitor to a load. When the second amplifier is operated to charge the second switched capacitor to the input voltage value, the first amplifier transfers the voltage across the first switched capacitor to the load.

BRIEF DESCRIPTION OF THE DRAWINGS

For a more complete understanding of the present invention, and for further advantages thereof, reference is now made to the following description taken in conjunction with the accompanying drawings in which.

DETAILED DESCRIPTION

The following discussion is presented to enable a person skilled in the art to make and use the invention. Various modifications will be readily apparent to those skilled in the art, and the general principles described herein may be applied to embodiments and applications other than those detailed below without departing from the spirit and scope of the present invention as defined herein. The present invention is not intended to be limited to the embodiments shown, but is to be accorded the widest scope consistent with the principles and features disclosed herein.

An Analog-to-Digital Converter (ADC) is provided to approach more closely the requirements of low power dissipation, small area, sampling rate capability of a few Msps, a 12-bit resolution, and minimum requirement on the clock.

Figure 1:
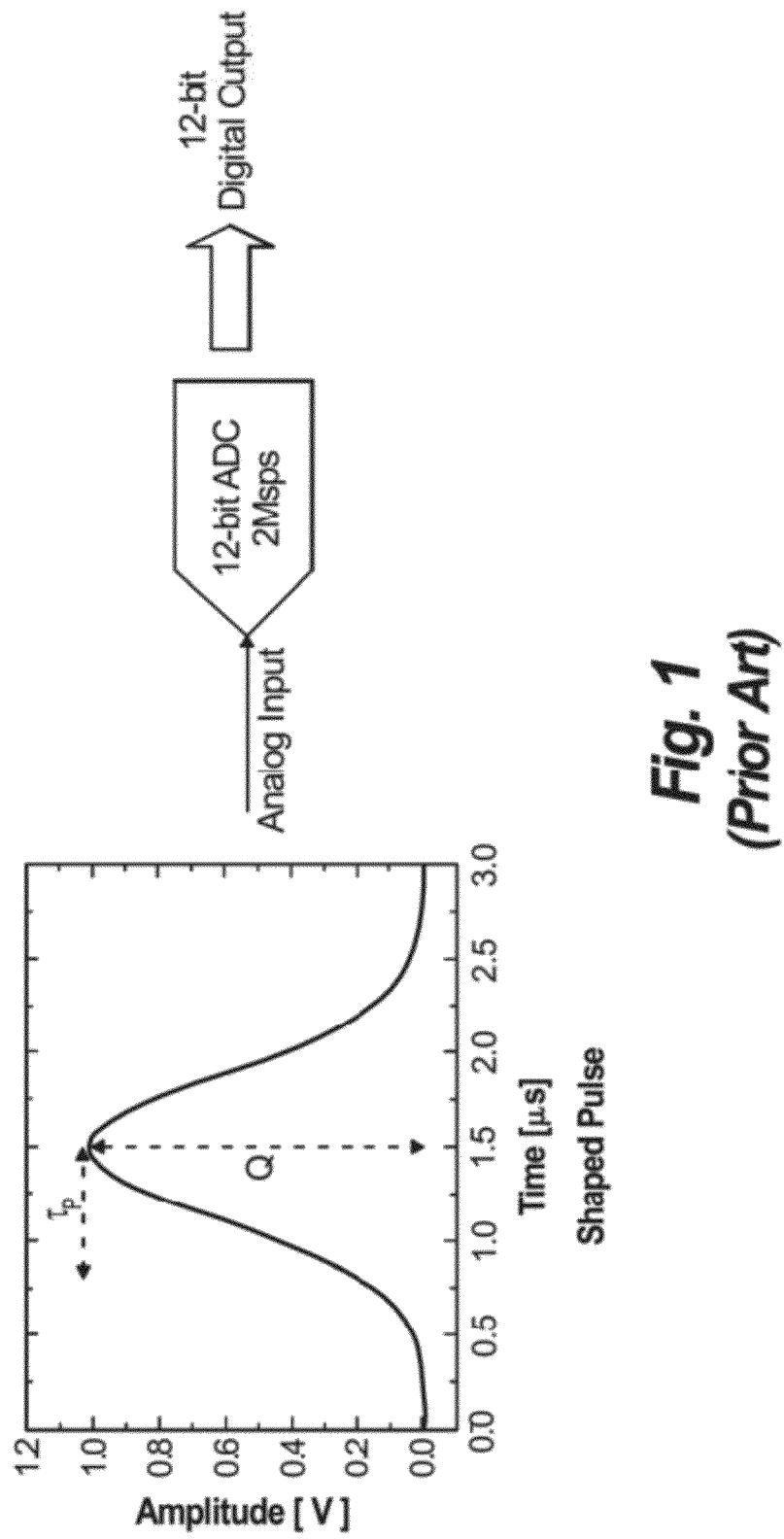
FIG. 1 is a block diagram showing a prior art example application of an analog-to-digital converter.
Figure 2A:
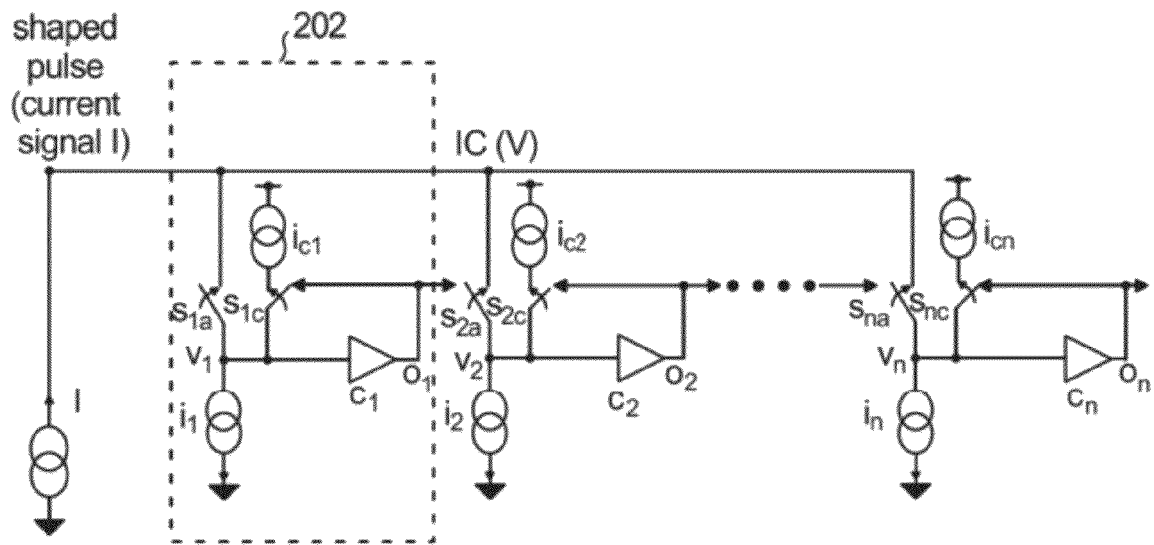
FIG. 2(a) is a simplified schematic diagram of an analog-to-digital converter according to a preferred embodiment of the present ADC.

FIG. 2(a) shows a simplified schematic diagram of a clockless ADC. The clockless ADC is a current-mode circuit which implies that the input to the circuit is current. A voltage to current converter must be used before the clockless ADC if the input signal is voltage. The overall structure of the clockless ADC is a combination of a thermometer converter and a subranging ADCs. An embodiment of an ADC includes two clockless ADCs, i.e., a Most Significant Bit (MSB) section and a Least Significant Bit (LSB) section, where the input is divided into a MSB 6 bits and LSB 6 bits, and each of these two sections gives a thermometer output.

The input current is represented as current I in FIG. 2(a). Each section, i.e., MSB section and LSB section, is composed of n identical cells 202. The n cells are coupled as shown in FIG. 2(a). Each j cell (where j=1 to n) is composed of a current sink $i_j$, switches $s_{ja}$ and $s_{jc}$, an inverter $c_j$ which acts as a comparator and a current steering source $i_{cj}$. Each of the switches $s_{ja}$ and $s_{jc}$ has a first end and a second end. The first end of switch $s_{ja}$ is operatively coupled to an input signal and the second end of switch $s_{jc}$ is operatively coupled to the second end of the switch $s_{ja}$. Each current sink $i_j$ is operatively coupled to the second end of the switch $s_{ja}$. Each inverter $c_j$ is operatively coupled to the second ends of the switches $s_{ja}$ and $s_{jc}$ at its input terminal.

Each current sink $i_j$ is equal to $i_{lsb}$ in the LSB cells. $i_{lsb}$ is the amount of current drawn by a unit current sink in the LSB. As shown in FIG. 2(a), $i_1 = i_2 = \ldots = i_n = i_{lsb}$. Each current steering source $i_{cj}$ is equal to $2^b * i_{lsb}$ in the MSB cells, where $2^b$ is the number of LSB cells.

The conversion of the input current to digital is carried out in 4 phases. In the first phase, referred to as RESET PHASE, all cells are reset by pulling the input node low.

In the second phase, referred to as MSB PHASE, the MSB cells are enabled and the LSB section is kept disabled. Within the MSB section, initially all the $s_{ja}$ switches are open and the $s_{jc}$ switches are closed. The current sink is supplied by the current steering source $i_{cj}$. All voltages $v_j$ are equal to 0V. The processing of the sampled input starts with the switch $s_{1a}$ closed, i.e., the first cell is switched on. The input current I is continuously compared to the unit current $i_1$ of the first cell. As long as the current I is lower than the current $i_1$, the voltage $v_1$ remains at a lower voltage level. If the current I is higher than the unit current $i_1$, then the voltage $v_1$, which is equal to the voltage V, increases until the comparator $c_1$ changes state. At that time the switch $s_{1c}$ is open and the switch $s_{2a}$ is closed adding one unit of current $i_2$. The $2^{nd}$ cell is switched on. The voltage $v_2$ rapidly increases towards the voltage V. The current I is now compared to the sum of $i_1$ and $i_2$ and, depending on the result, V will decrease or will increase forcing the next comparator $c_2$ to change state. When comparator $c_2$ changes state, $s_{2c}$ is open and the $3^{rd}$ cell is switched on. A new unit current $i_3$ will be added for the current comparison and so on. The enabling of further units of current will proceed until the input current is greater than the total current of the cells switched on. The state of the MSB cells is maintained by a regenerative cross-coupled inverter loop.

Figure 2B:
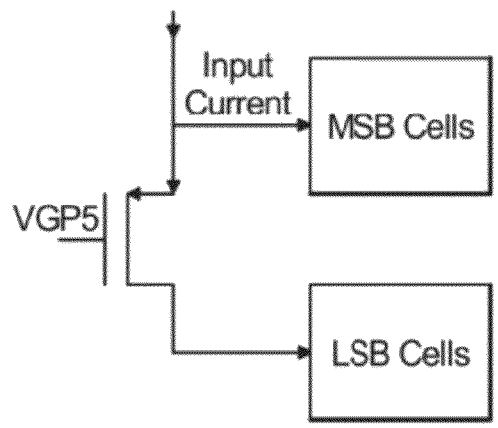
FIG. 2(b) is a schematic diagram illustrating the coupling of the MSB section and the LSB section according to a preferred embodiment of the present ADC.

In the third phase, referred to as LSB PHASE, the inverter loop in the MSB cells is enabled and the first cell of the LSB section is switched on. FIG. 2(b) is a schematic diagram illustrating a preferred embodiment for coupling the MSB section and the LSB section. The input node of the LSB section is separated from the input node of the MSB section using a single transistor which is biased with a voltage VGP5. The residual current from the MSB section is input to the LSB section. Operation of the LSB section is identical to the MSB section except for the value of the current in each cell. Total current flowing through the enabled or switched-on cells is equal to or less than the residual current from the MSB section. The residual current from the LSB is lower than 1 LSB resolution.

During the LSB conversion, when a large amount of current flows into the cells which pulls up the IC node in FIG. 2(a), the cells are enabled very rapidly causing over-conversion. Over-conversion implies that a greater number of cells are switched on than required by the input current. These extra cells that have been switched on are then disabled lowering the IC node voltage and the process continues until the correct number of cells are enabled. This oscillation causes a delay in the LSB section. In order to overcome this effect, a block is added to the LSB section which absorbs a part of the input current initially and then releases it after a certain amount of time. An embodiment of circuit of the block is shown in FIG. 3(a).

Figure 3A:
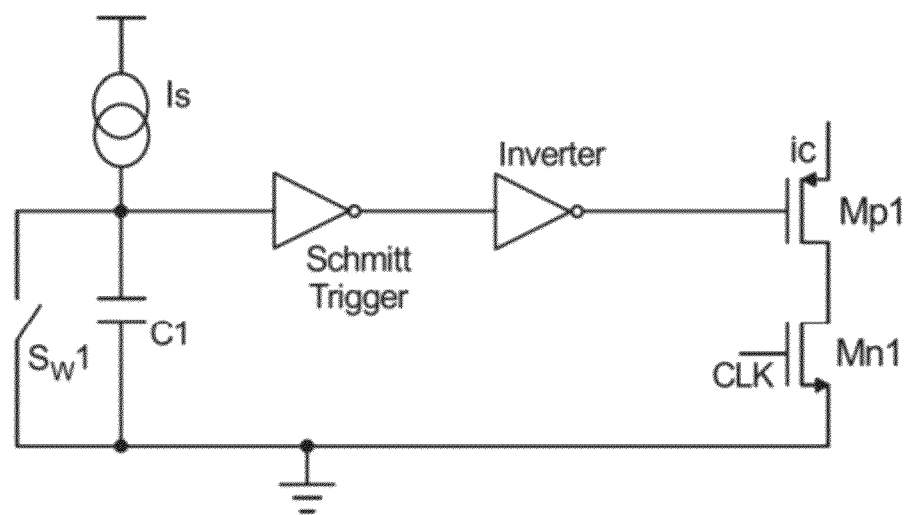
FIG. 3(a) depicts a diagram of a transient absorbing circuit according to an embodiment of the present ADC.

The circuit in FIG. 3(a) includes a current source Is, a capacitor C1, a switch Sw1, a Schmitt trigger, an inverter, a transistor Mn1, and a PMOS transistor Mp1 that absorbs the transient current. At the start of the LSB PHASE, switch Sw1 is open, and Mn1, which acts as a switch, is closed. The voltage across the capacitor C1 is initially zero. Transistor Mp1 absorbs some of the input current, keeping the IC node voltage from increasing excessively. The IC node voltage then starts reducing, which in turn decreases the Vgs value of Mp1. Thus less current is drawn to Mp1 from the input signal enabling more current to flow into the cells. The current source Is gradually charges C1, increasing the voltage at the input of the Schmitt trigger. When the Schmitt trigger changes state, Mp1 shuts off and releases the current back into the LSB.

Figure 3B:
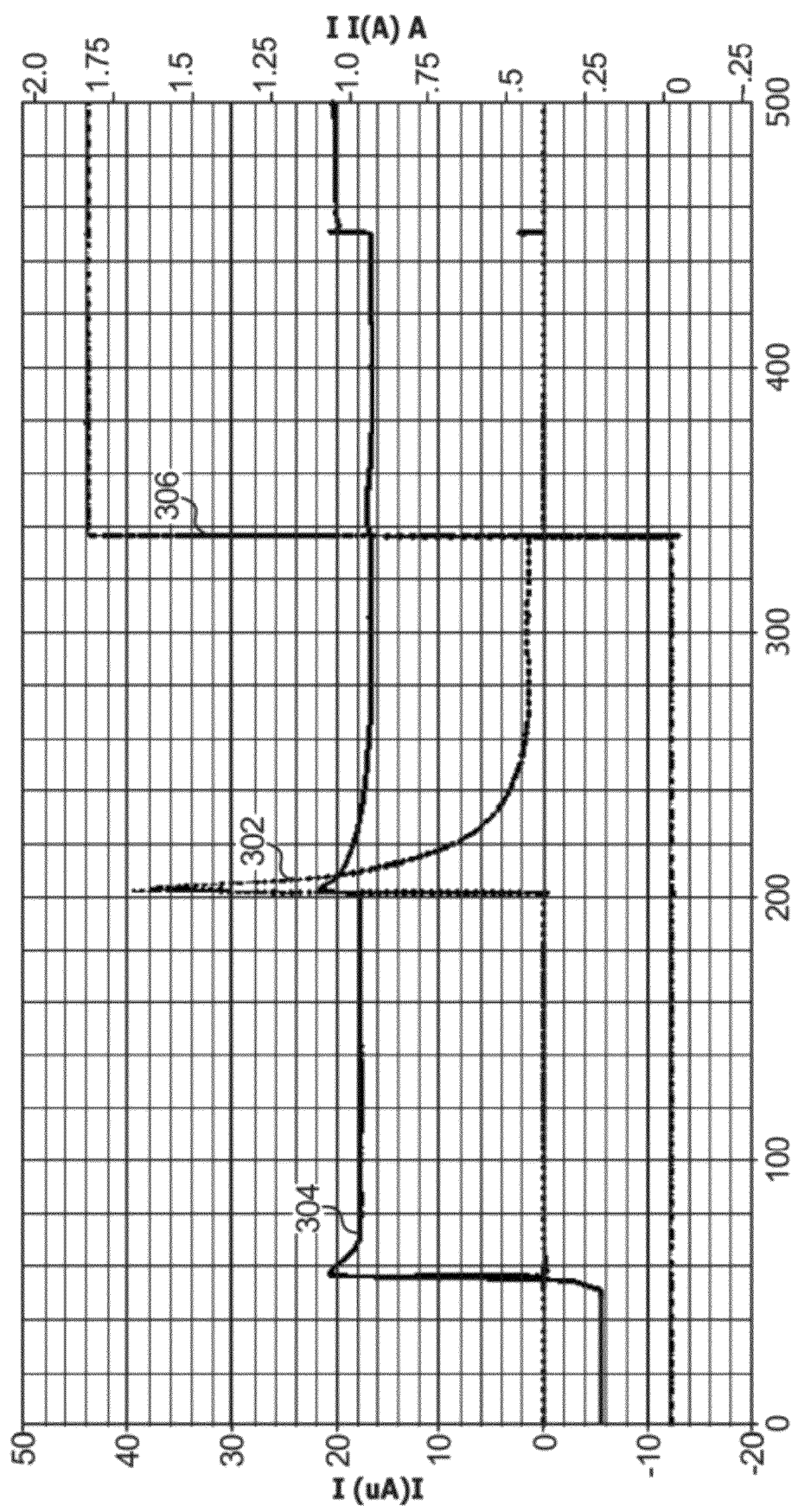
FIG. 3(b) illustrates simulation results of the transient absorbing circuit in FIG. 3(a)

FIG. 3(b) shows the simulation of the circuit in FIG. 3(a). Curve 302 is a representation of the current being absorbed by the transient absorbing PMOS transistor Mp1. Curve 304 shows the variation of the IC node voltage. Curve 306 shows that the inverter changes state when the voltage across capacitor C1 reaches a specific voltage value.

In the last phase, referred to as ENCODE PHASE, the thermometer code generated by the MSB and the LSB sections is converted to binary and latched. Referring to FIG. 2(a), $o_1, O_2, \ldots o_n$ is the output node of each of the n cells in the MSB section and the LSB section, respectively. This data is available until the ENCODE PHASE of the next conversion phase starts.

Figure 4:
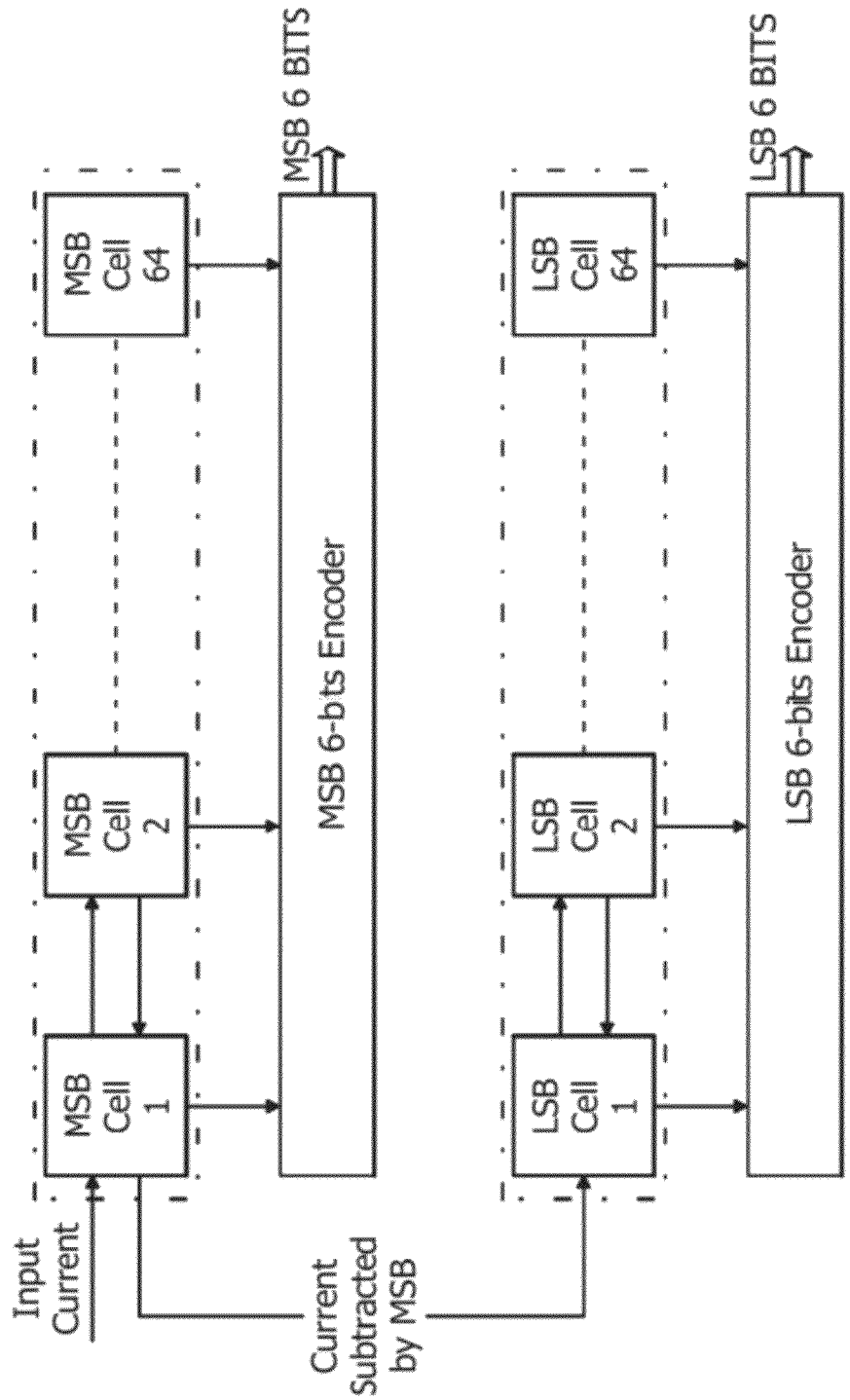
FIG. 4 is a block diagram of a 12-bit analog-to-digital converter according to an embodiment of the present ADC.

FIG. 4 is a block diagram of a 12-bit analog-to-digital converter. The input current is input into 64 MSB cells, and output of each cell is input into a thermometer to binary encoder, which outputs the 6 MSB bits. The residual current from the MSB section is input into 64 LSB cells. Output of each LSB cell is input into another thermometer to binary encoder, which outputs the 6 LSB bits.

Figure 5:
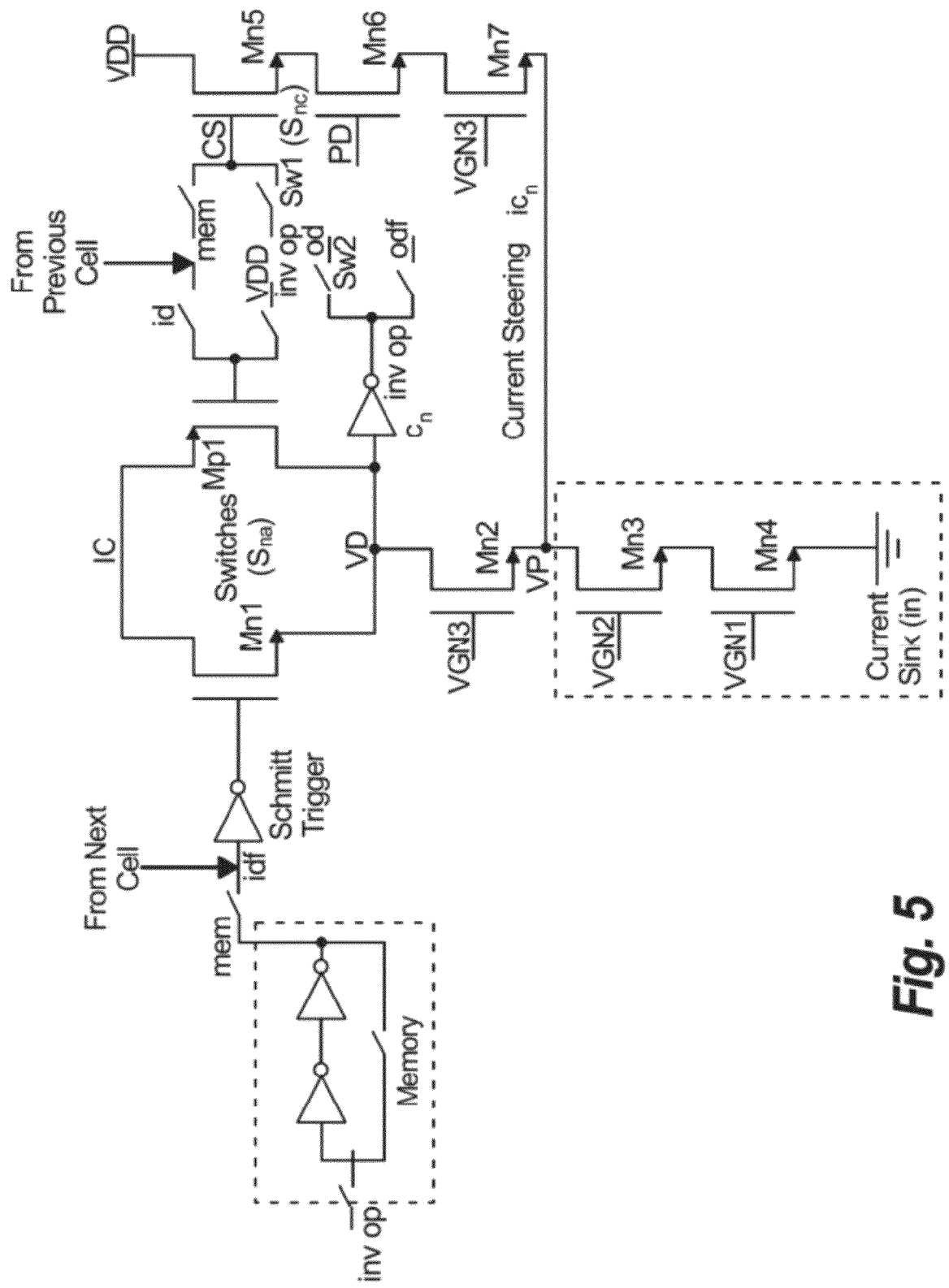
FIG. 5 depicts a schematic diagram of circuit realization of an individual cell in FIG. 2(a)

FIG. 5 depicts a schematic diagram of circuit realization of an individual cell as described in FIG. 2(a). Transistors Mp1 and Mn1 act as the input switches $s_{ja}$ (j=1 to n). Mp1 is enabled by the previous cell and Mn1 is enabled by the next cell to keep the current flowing through the cell. Transistors Mn3 and Mn4 act as the current sink $i_j$. Mn5 is a Current Steering (CS) switch $s_{jc}$. Transistors Mn7 and Mn2 are cascode transistors whose gate voltages are equal. Node VP, which is the current source node $i_{cj}$, is kept precharged to a value VGN3-$V_{thMn7}$ before the cell is enabled. Initially, no current flows through transistor Mn2, and the nodes VD and VP are equal. When the cell is enabled, the input current charges the decision node VD. A very small amount of current is required to increase voltage VD and to let the current flow through Mn2. As the decision node VD rises, the inverter output voltage of inverter inv in FIG. 5, which corresponds to inverter $c_j$ in FIG. 2(a), starts reducing, which switches off the CS switch. The current source then gets current only from the input. In the case that no CS is used in the system, the node VP would be zero initially, which implies that a very small current (especially for the last couple of cells) will be charging the node to the required value. This charging time slows down the conversion. The CS system thus speeds up the system by keeping the node VP precharged.

A sample and hold (S&H) block is an important building block of an ADC, since it ensures that when the input signal changes, the input to the ADC is kept constant during the conversion. An S&H circuit is provided that operates at a speed that supports the ADC and also provides the required accuracy. Additionally, the S&H performs the operation of voltage to current conversion required by the ADC.

Figure 6:
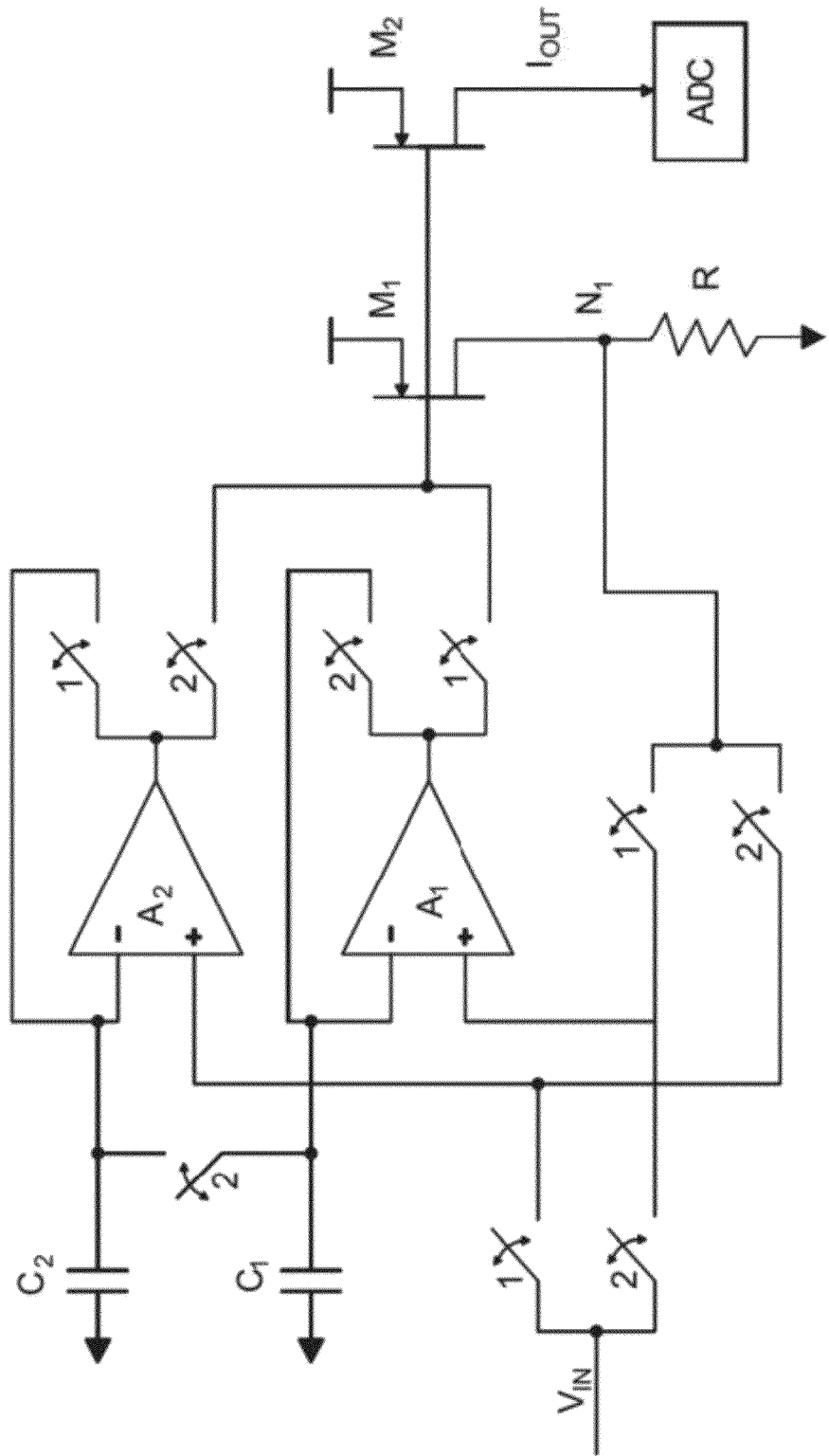
FIG. 6 is a sample and hold circuit according to an embodiment of the present ADC.

FIG. 6 depicts an S&H circuit, which includes two amplifiers $A_1$ and $A_2$, and switched capacitors $C_1$ and $C_2$. The operation is carried out in two phases as follows.

Phase 1: All switches 2 are closed and switches 1 are open. $A_1$ charges $C_1$ to $V_{IN}$. $A_2$ transfers the voltage on $C_1$ and $C_2$, which have been precharged to $V_{IN}$, to resistor R. Specifically, the voltage on the $C_2$-$C_1$ parallel capacitor network is copied to the positive terminal of amplifier $A_2$ which is connected to node $N_1$ of resistor R. This is the sampling period where the input signal is stored along with the unavoidable error offset from the amplifier $A_1$ on capacitor $C_1$.

Phase 2: All switches 1 are closed and switches 2 are open. $A_2$ charges $C_2$ to $V_{IN}$. $A_1$ transfers the voltage on $C_1$ which has been previously charged to $V_{IN}$ to R. Specifically, the voltage on the capacitor $C_1$ is copied to the positive terminal of amplifier $A_1$ which is connected to node $N_1$ of resistor R. The error offset is subtracted, thus providing high accuracy. This phase is the hold phase where the input voltage is held and converted to current which is input to the ADC.

Transistor $M_2$ copies and multiplies as needed the current flowing through $M_1$ and R. This scaled current is the input to the ADC.

Figure 7:
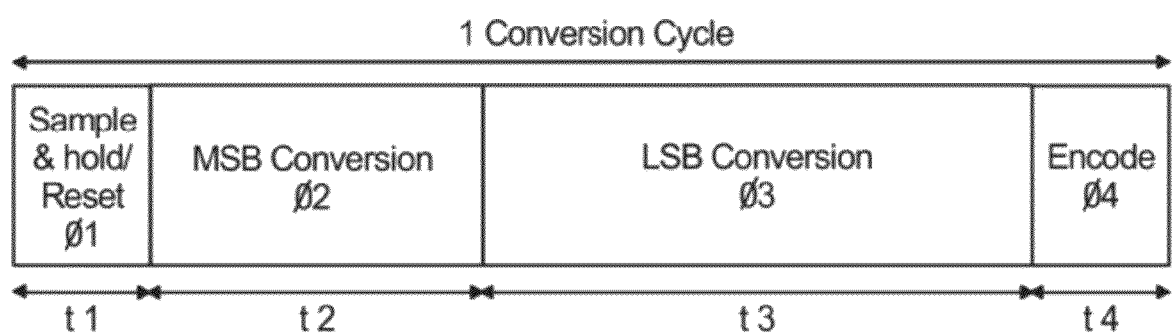
FIG. 7 is a diagram for analog-to-digital converter timing according to an embodiment of the present ADC.

An ADC as described in an embodiment of the present disclosure has been designed, simulated and fabricated in a commercial 180 nm Metal Oxide Semiconductor (CMOS) technology. A simplified timing diagram of the ADC is shown in FIG. 7. The sample and hold and the ADC reset phases overlap. The other three phases are as described above. A single clock may trigger the whole process and generate the internal timings.

Figure 8:
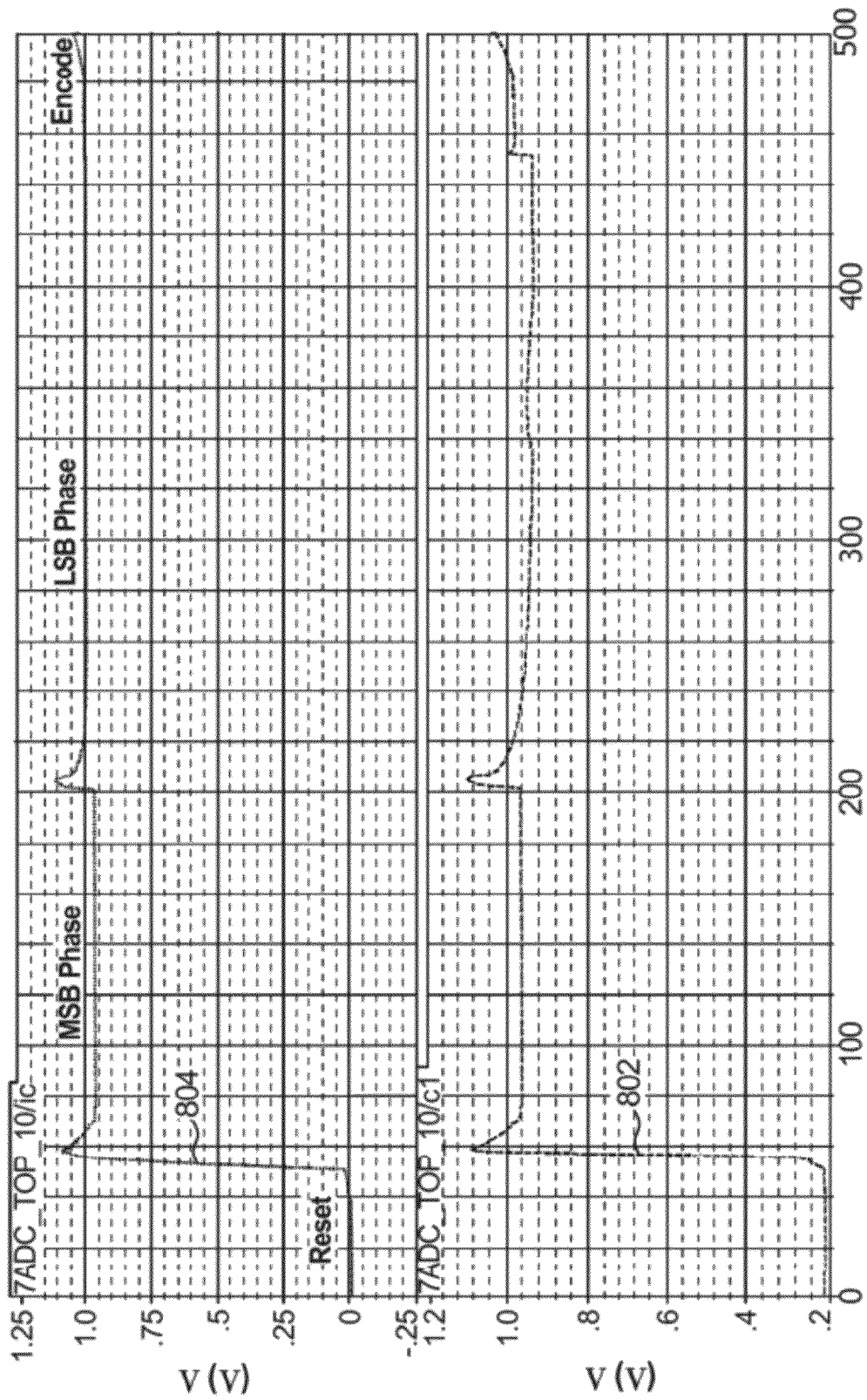
FIG. 8 is a graph illustrating the voltage on the input common node of an analog-to-digital converter according to an embodiment of the present invention.

FIG. 8 is a graph showing the voltage on the input common node of the ADC. Curve 802 is the voltage on the common node of the LSB cells. Curve 804 is the voltage on the common node of the MSB cells. During a conversion, both the nodes move up as current sources are added, oscillate as they adjust the number of cells drawing current and settle to a constant voltage.

The power dissipated by the ADC circuit equals the unit current times the number of discrete levels n in addition to the power dissipated by the voltage to current converter, and it can be contained within a few mW. The area occupied by the ADC is 0.45 mm². Compared to conventional ADCs, the present embodiments have the advantage of low power consumption and area at a high resolution and high sampling rate, along with minimum requirement on the clock.

Figure 9:
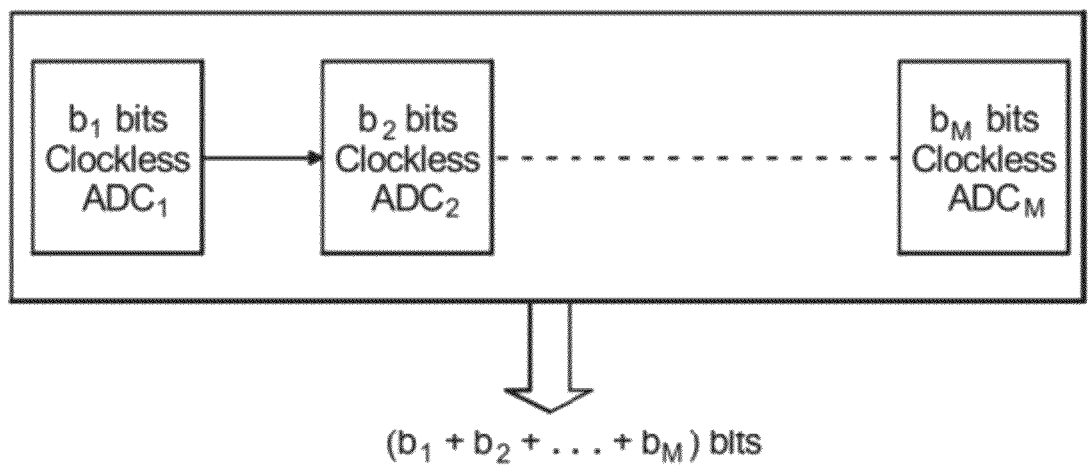
FIG. 9 is a block diagram of an analog-to-digital converter according to an embodiment of the present ADC.

Multiple clockless ADCs, e.g., the clockless ADC shown in FIG. 2(a), can be combined to provide an expected speed and resolution for analog-to-digital conversion. FIG. 9 shows a block diagram of an ADC including M clockless ADCs. As shown in FIG. 9, the first $ADC_1$ provides a resolution of $b_1$ bits, the second $ADC_2$ provides a resolution of $b_2$ bits, and the last $ADC_M$ provides a resolution of $b_M$ bits. The net resolution of the ADC implemented in this manner is: $(b_1+b_2+\ldots+b_M)$ bits.

To achieve the required speed, power and resolution, the resolution of each clockless ADC and the number of clockless ADCs must be optimized. The optimization depends on the technologies used.

Figure 10:
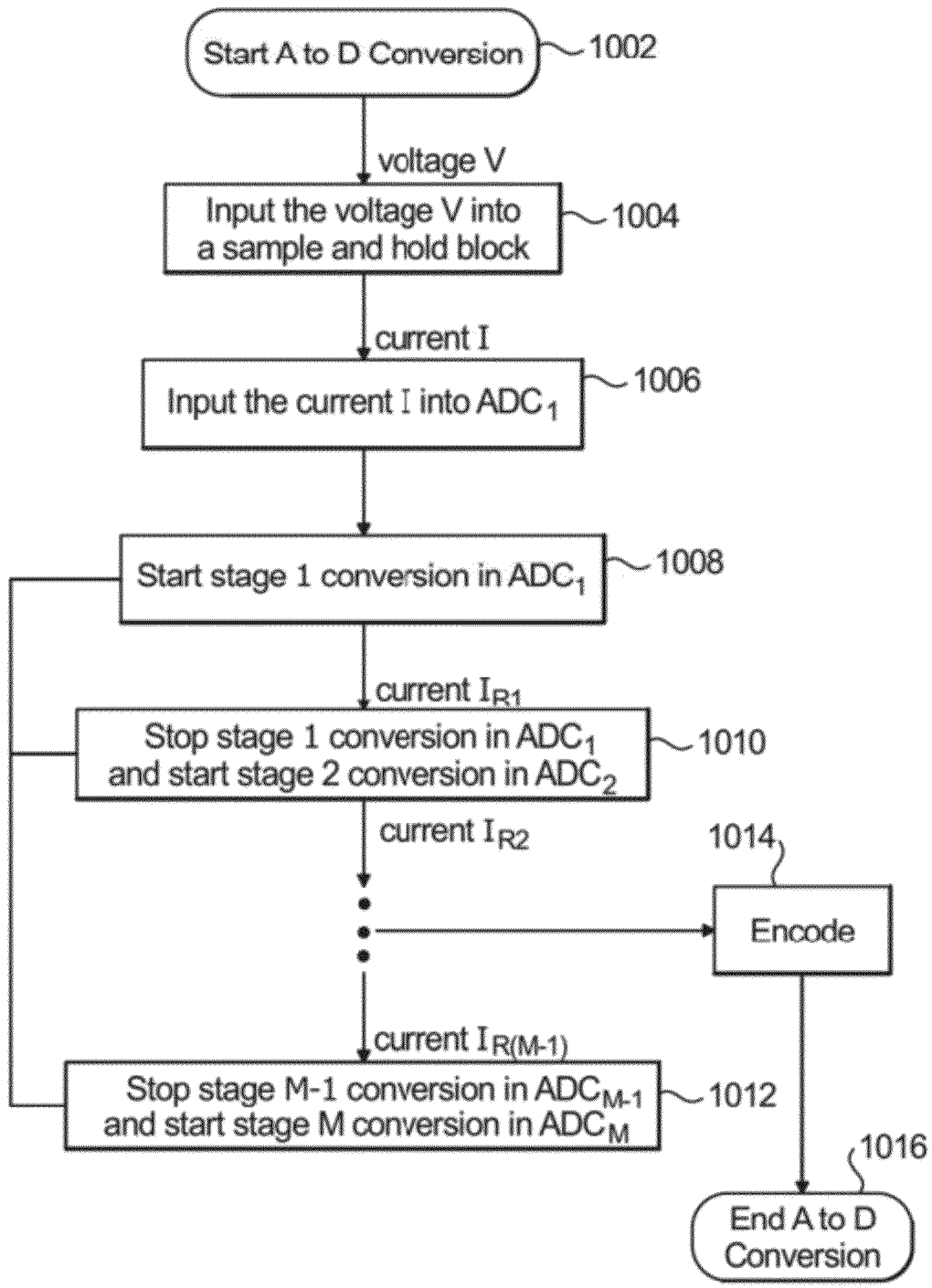
FIG. 10 is a flow chart for operations of the analog-to-digital converter in FIG. 9 according to an embodiment of the present ADC.

FIG. 10 is a flow chart showing the operation of the M clockless ADCs in FIG. 9. An input analog signal is converted to a digital signal in M stages. When the analog-to-digital conversion is started (step 1002), an input voltage of the input signal is given to a sample and hold block (step 1004). The sample and hold block also converts the input voltage to a current I. The current output I from the sample and hold block is then input to the first clockless $ADC_1$ (step 1006).

Clockless $ADC_1$ receives the current I and starts the conversion of the input signal in stage 1 (step 1008). $ADC_1$ has a resolution of $b_1$ bits. The number of cells in $ADC_1$ is given as:

$$n_1 = 2^{b_1}$$

Each cell in $ADC_1$ has a current source which carries a current $i_{n1}$ given as:

$$i_{n1} = n_2 * i_{n2}$$

where, $n_2$ is the number of cells in $ADC_2$, and $i_{n2}$ is the current carried by the current source in a single cell in $ADC_2$.

The number of cells that are switched on in $ADC_1$ is given as:

$$n_{c1} = \text{Quotient}\left(\frac{I}{i_{n1}}\right)$$

The residual current from stage 1 flows into $ADC_2$, which is given as:

$$I_{R1} = I - i_{n1} * n_{c1}$$

Then, stage 1 of the conversion is stopped or disabled and stage 2 conversion begins in $ADC_2$ (step 1010). The residual current flowing into clockless $ADC_2$ is processed in the same way as in $ADC_1$. $ADC_2$ has $n_2$ cells and a resolution of $b_2$ bits. Each cell in $ADC_2$ has a current source which carries a current $i_{n2}$ given as:

$$i_{n2} = n_3 * i_{n3}$$

where $n_3$ is the number of cells in $ADC_3$ and $i_{n3}$ is the current in a single cell in $ADC_3$.

The residual current from stage 2 that flows into $ADC_3$ is given as:

$$I_{R2} = I_{R1} - i_{n2} * n_{c2}$$

where, $n_{c2}$ is the number of cells switched on in $ADC_2$.

Similarly, the stage 2 conversion is stopped and stage 3 conversion starts in $ADC_3$. The process continues until the last stage of the conversion, i.e., stage M conversion, is performed in $ADC_M$ (step 1012), where $ADC_M$ has a resolution of $b_M$ bits. The number of cells in $ADC_M$ is $n_M$. Each cell in $ADC_M$ has a current source which carries a current $i_{nM}$ given as:

$$i_{nM} = i_{lsb}.$$

When all the clockless ADCs have completed the conversion, a thermometer to binary encoder is enabled (step 1014). The thermometer to binary encoder uses the number of cells that have been switched on in all the stages to compute the binary value of the input current I. The output of the encoder is $B1_{b1bits}B2_{b2bits}\ldots BM_{bMbits}$, where, B1 is a group of $b_1$ bits, B2 is a group of $b_2$ bits and BM is a group of $b_M$ bits. The analog to digital conversion is thus ended (step 1016) with a resolution of $(b_1+b_2+\ldots+b_M)$ bits achieved.

Figure 11:
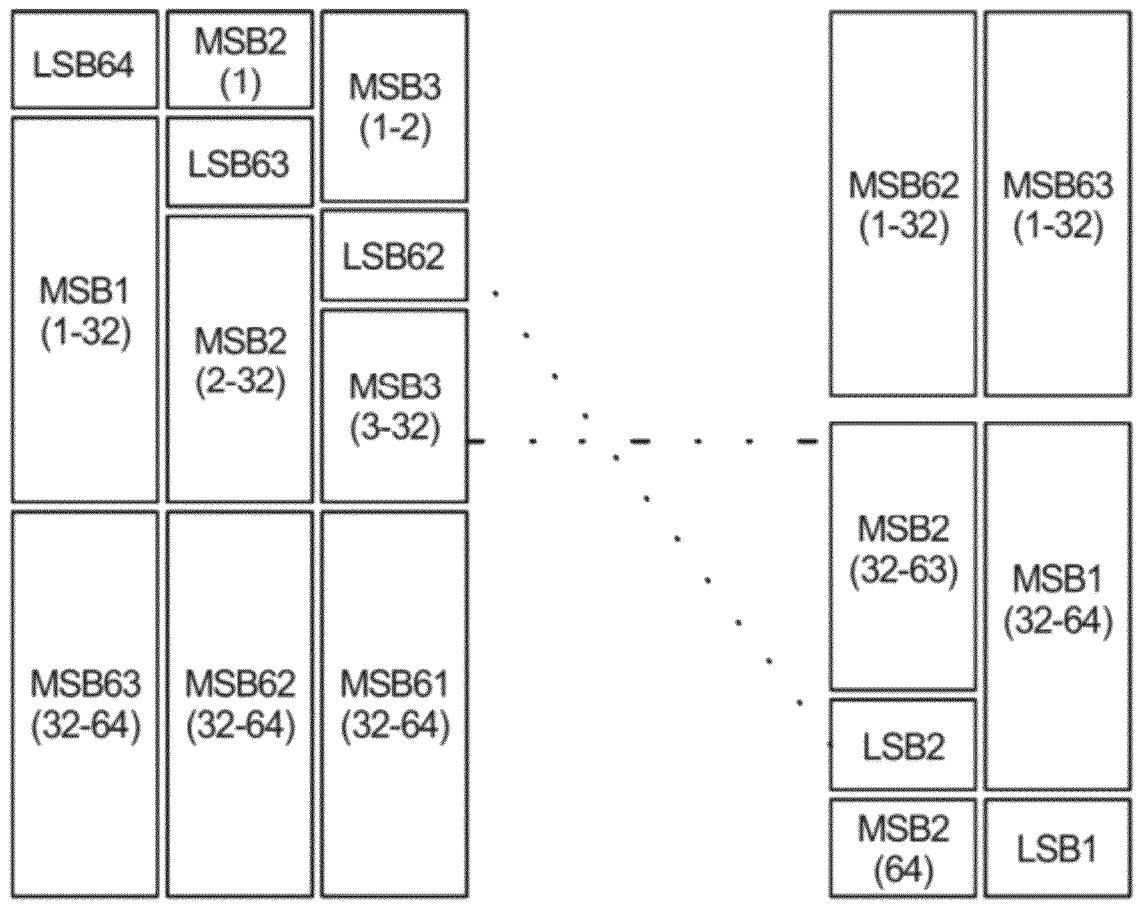
FIG. 11 is a block diagram illustrating a layout technique used for an analog-to-digital converter according to a preferred embodiment of the present ADC.
Figure 12:
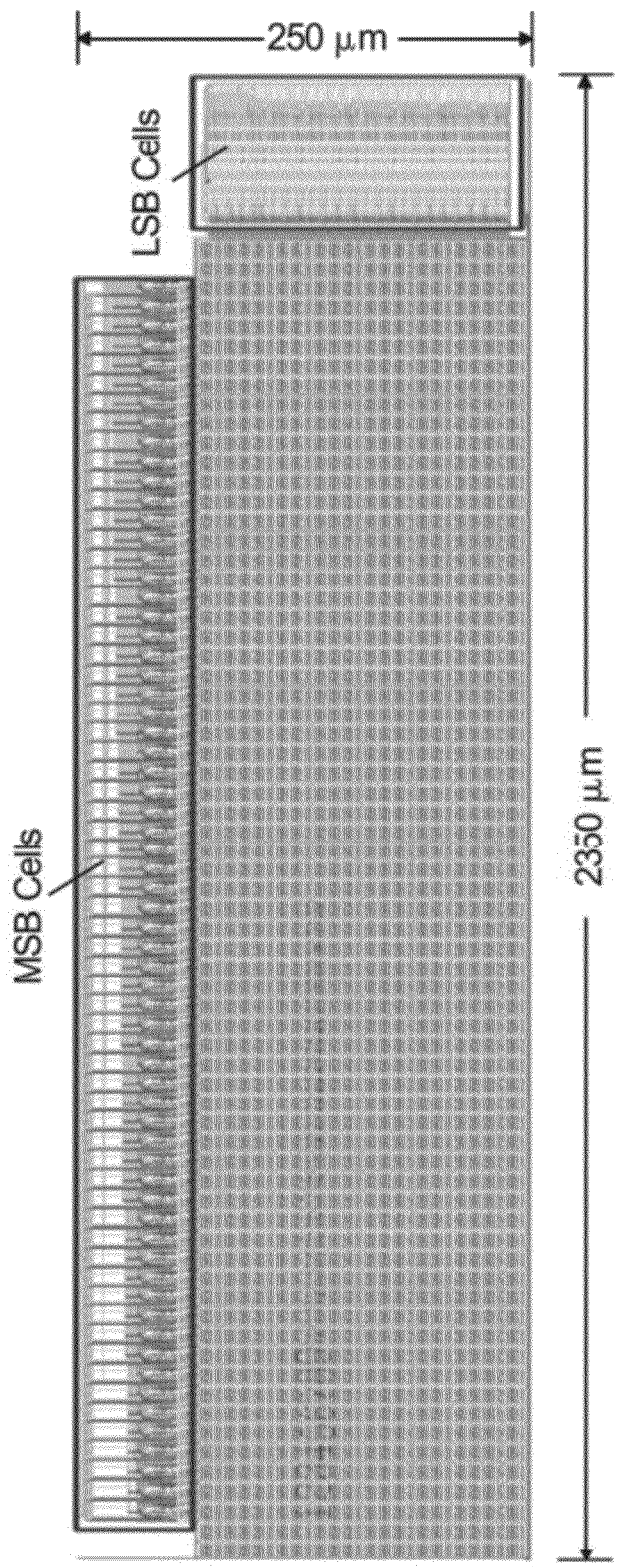
FIG. 12 is a diagram illustrating an actual layout of an analog-to-digital converter according to a preferred embodiment of the present ADC.

The high operation performance of a 12-bit current-mode ADC requires that all current sinks need to carry exactly the same amount of current. Fabrication process gradients may cause mismatch between transistors, that is, transistors which are identical by design may show deviations in device characteristics after fabrication. Thus matching between current sink transistors is one of the factors that affect the accuracy of the ADC, and appropriate layout of these transistors is important to reduce mismatch effects. The block diagram in FIG. 11 illustrates a layout technique used to implement an embodiment of an ADC as described in the present disclosure. The LSB section with 64 current sink transistors is arranged diagonally from left to right with the first current sink at the bottom right and the last LSB cell to be switched on, at the top left. For the MSB section, each MSB cell is split into two groups of 32 transistors. These MSB cells are arranged with a common center technique. The first group of the first MSB cell is in the upper left area. The second group of the first MSB cell is in the lower right side. The first group of the last or 63rd MSB cell is on the upper right side. The second group of the last MSB cell is on the lower left side. The 32nd MSB cell is in the center along with MSB cell 31. In this way a common center layout is achieved. FIG. 12 shows the actual layout using the technique of FIG. 11. The center matrix of cells represents the 4095 current sinks.

It will be appreciated by persons skilled in the art that the present disclosure is not limited to what has been particularly shown and described hereinabove. Rather, the scope of the present invention is defined by the claims which follow. It should further be understood that the above description is only representative of illustrative examples of embodiments. For the reader's convenience, the above description has focused on a representative sample of possible embodiments, a sample that teaches the principles of the present invention. Other embodiments may result from a different combination of portions of different embodiments.

The description has not attempted to exhaustively enumerate all possible variations. That alternate embodiments may not have been presented for a specific portion of the invention, and may result from a different combination of described portions, or that other undescribed alternate embodiments may be available for a portion, is not to be considered a disclaimer of those alternate embodiments. It will be appreciated that many of those undescribed embodiments are within the literal scope of the following claims, and others are equivalent. Furthermore, all references, publications, U.S. patents, and U.S. patent application Publications cited throughout this specification are hereby incorporated by reference as if fully set forth in this specification.

The invention claimed is:

1. An analog-to-digital converter, comprising M Analog-to-Digital Converters (ADCs) $ADC_j$, j=1, 2, . . . , M, M being an integer and greater than 1, and an $ADC_j$, j=1, 2, . . . , M, comprising $n_j$ cells each of which comprises:
a first switch comprising a first end and a second end, the first end being operatively coupled to an input signal of the $ADC_j$, j=1, 2, . . . , M;
a second switch comprising a first end and a second end, the second end being operatively coupled to the second end of the first switch;
a current sink operatively coupled to the second end of the first switch, the current sink being supplied by a current source; and
an inverter comprising an input terminal and an output terminal, the input terminal being operatively coupled to the second end of the first switch and the second end of the second switch;
wherein an $ADC_j$, j=2, 3, . . . , M, is enabled to perform analog-to-digital conversion on a residual current of $ADC_{j-1}$ after $ADC_{j-1}$ has completed its analog-to-digital conversion and has been disabled, the residual current of $ADC_{j-1}$ being represented by $I_{R(j-1)}=I_{R(j-2)}-i_{n(j-1)}*n_{c(j-1)}$, where $I_{R0}$ is the current associated with the input signal of $ADC_1$, $n_{c(j-1)}$ is the number of cells in $ADC_{j-1}$ that are switched on, and $i_{n(j-1)}$ is the current carried by the current source in a single cell in $ADC_{j-1}$;
wherein when an $ADC_j$, j=1, 2, 3, . . . , M, is enabled, the first switch of a first cell is closed, the first switches of a $2^{nd}$ to $n_j^{th}$ cells are open, and the second switches of the $n_j$ cells are closed; and the inverter of a $k^{th}$ cell, k=1, 2, 3, . . . , $n_j$, in $ADC_j$ changes state if the current associated with the input signal of $ADC_j$ is higher than a threshold determined by the current associated with the k current sinks of the $1^{st}$ to $k^{th}$ cells, the second switch of the $k^{th}$ cell is open in response to the changing state of the inverter of the $k^{th}$ cell, and the first switch of a $(k+1)^{th}$ cell is closed in response to the changing state of the inverter of the $k^{th}$ cell if k is less than $n_j$.

2. The analog-to-digital converter of claim 1, further comprising a sample and hold circuit, the sample and hold circuit comprising:
a first amplifier having a positive terminal and a negative terminal, and a second amplifier having a positive terminal and a negative terminal;
a first switched capacitor coupled to the negative terminal of the first amplifier, and a second switched capacitor coupled to the negative terminal of the second amplifier;
wherein when the first amplifier is operated to charge the first switched capacitor to an input voltage value, the second amplifier transfers the voltage across the first switched capacitor or the second switched capacitor to a load, and when the second amplifier is operated to charge the second switched capacitor to the input voltage value, the first amplifier transfers the voltage across the first switched capacitor to the load.

3. The analog-to-digital converter of claim 1, further comprising a transient absorbing circuit for at least one of the (M−1) $ADC_j$, j=2, 3, . . . M, wherein the transient absorbing circuit of an $ADC_j$ absorbs a part of the current associated with the input signal of the $ADC_j$, and releases the part of the current after a predetermined amount of time.

4. The analog-to-digital converter of claim 3, wherein the transient absorbing circuit comprises a transistor for absorbing current, and a Schmitt trigger, wherein current absorbed by the transistor is released if the Schmitt trigger changes state.

5. A method of providing analog-to-digital conversion for an input signal by M Analog-to-Digital Converters (ADCs) $ADC_j$, j=1, 2, . . . , M, M being an integer and greater than 1, and an $ADC_j$, j=1, 2, . . . , M, comprising $n_j$ cells each of which comprises a first switch, a second switch, a current sink supplied by a current source, and an inverter, the method comprising:
performing analog-to-digital conversion by $ADC_1$ on a current I associated with the input signal;
disabling $ADC_1$ after the analog-to-digital conversion has been completed by $ADC_1$ and maintaining the analog-to-digital conversion result of $ADC_1$;
performing the following steps a) and b) by $ADC_j$, j=2, 3, . . . , M:
a) performing analog-to-digital conversion by $ADC_j$ on the residual current of $ADC_{j-1}$, the residual current of $ADC_{j-1}$ being represented by $I_{R(j-1)}=I_{R(j-2)}-i_{(j-1)}*n_{c(j-1)}$, where $I_{R0}=I$, $n_{c(j-1)}$ is the number of cells in $ADC_{j-1}$ that are switched on, and $i_{n(j-1)}$ is the current carried by the current source in a single cell in $ADC_{j-1}$;
b) disabling $ADC_j$ after the analog-to-digital conversion has been completed by $ADC_j$ and maintaining the analog-to-digital conversion result of $ADC_j$; and
generating a binary value of the current I associated with the input signal using the analog-to-digital conversion results of the M $ADC_j$, j=1, 2, . . . , M.

6. The method of claim 5, further comprising enabling a sample and hold circuit.

7. The method of claim 5, further comprising enabling a transient absorbing circuit for at least one of the (M−1) $ADC_j$, j=2, 3, . . . M, wherein the transient absorbing circuit of an $ADC_j$ absorbs a part of the current on which analog-to-digital conversion is to be performed by the $ADC_j$, and releases the part of the current after a predetermined amount of time.

8. An analog-to-digital converter comprising:
a first section comprising n cells, and a second section comprising n cells, n being an integer, the first section and the second section being coupled through at least one transistor, and each of the n cells in the first and the second sections comprising:
- a first switch comprising a first end and a second end, the first end being operatively coupled to an input signal of the corresponding section;
- a second switch comprising a first end and a second end, the second end being operatively coupled to the second end of the first switch;
- a current sink operatively coupled to the second end of the first switch, the current sink being supplied by a current source; and
- an inverter comprising an input terminal and an output terminal, the input terminal being operatively coupled to the second end of the first switch and the second end of the second switch;

wherein in the first section and the second section, respectively, the first switch of a first cell is closed, the first switches of a $2^{nd}$ to $n^{th}$ cells are open, and the second switches of the n cells are closed; and wherein the inverter of a $k^{th}$ cell, k=1, 2, 3, ..., n, in the first section and the second section, respectively, changes state if the current associated with the input signal of the corresponding section is higher than a threshold determined by the current associated with the k current sinks of the $1^{st}$ to $k^{th}$ cells, the second switch of the $k^{th}$ cell is open in response to the changing state of the inverter of the $k^{th}$ cell, and the first switch of a $(k+1)^{th}$ cell is closed in response to the changing state of the inverter of the $k^{th}$ cell if k is less than n.

9. The analog-to-digital converter of claim 8, further comprising a transient absorbing circuit, wherein the transient absorbing circuit absorbs a part of the current associated with the input signal of the second section, and releases the part of the current after a predetermined amount of time.

10. The analog-to-digital converter of claim 9, wherein the transient absorbing circuit comprises a transistor for absorbing current, and a Schmitt trigger, wherein current absorbed by the transistor is released if the Schmitt trigger changes state.

11. The analog-to-digital converter of claim 8, further comprising a sample and hold circuit, the sample and hold circuit comprising:
- a first amplifier having a positive terminal and a negative terminal, and a second amplifier having a positive terminal and a negative terminal; and
- a first switched capacitor coupled to the negative terminal of the first amplifier and a second switched capacitor coupled to the negative terminal of the second amplifier;
wherein when the first amplifier is operated to charge the first switched capacitor to an input voltage value, the second amplifier transfers the voltage across the first switched capacitor or the second switched capacitor to a load, and when the second amplifier is operated to charge the second switched capacitor to the input voltage value, the first amplifier transfers the voltage across the first switched capacitor to the load.

12. The analog-to-digital converter of claim 8, wherein the threshold is determined by the sum of the current associated with the k current sinks of the $1^{st}$ to $k^{th}$ cells.

13. The analog-to-digital converter of claim 8, wherein the first section is a most significant bit section for producing the most significant bits of the current associated with the input signal of the first section, and the second section is a least significant bit section for producing the least significant bits of the current associated with the input signal of the first section.

14. The analog-to-digital converter of claim 8, wherein the current associated with the input signal of the second section is the residual current from the first section that is represented by $I_{R1}=I_{R0}-i_{n1}*n_{c1}$, where $I_{R0}$ is the current associated with the input signal of the first section, $n_{c1}$ is the number of cells in the first section that are switched on, and $i_{n1}$ is the current carried by the current source in a single cell in the first section.

15. An analog-to-digital converter comprising
- a first section and a second section, the first section being coupled to the second section through at least one transistor, and each of the first and second section comprising a first cell comprising:
  - a first switch comprising a first end and a second end, the first end being operatively coupled to an input signal of the corresponding section;
  - a second switch comprising a first end and a second end, the second end being operatively coupled to the second end of the first switch;
  - a first current sink operatively coupled to the second end of the first switch, the first current sink being supplied by a first current source; and
  - a first inverter comprising an input terminal and an output terminal, the input terminal being operatively coupled to the second end of the first switch and the second end of the second switch;
- wherein the first switch and the second switch of the first cell in the first section and the second section are closed; and
- wherein in the first section and the second section, respectively, the first inverter changes state if the current associated with the input signal of the corresponding section is higher than a first threshold determined by the current associated with the first current sink, and the second switch is open in response to the changing state of the first inverter.

16. The analog-to-digital converter of claim 15, wherein each of the first section and the second section further comprises a second cell comprising:
- a third switch comprising a first end and a second end, the first end being operatively coupled to the input signal of the corresponding section;
- a fourth switch comprising a first end and a second end, the second end being operatively coupled to the second end of the third switch;
- a second current sink operatively coupled to the second end of the third switch, the second current sink being supplied by a second current source; and
- a second inverter comprising an input terminal and an output terminal, the input terminal being operatively coupled to the second end of the third switch and the second end of the fourth switch;
wherein in the first section and the second section, respectively, the fourth switch is closed, and the third switch is closed if the first inverter changes state; and
wherein in the first section and the second section, respectively, the second inverter changes state if the current associated with the input signal of the corresponding section is higher than a second threshold determined by the current associated with the first current sink and the second current sink, and the fourth switch is open in response to the changing state of the second inverter.

17. The analog-to-digital converter of claim 16, wherein the current associated with the input signal of the second section is the residual current from the first section that is represented by $I_{R1}=I_{R0}-i_{n1}*n_{c1}$, where $I_{R0}$ is the current associated with the input signal of the first section, $n_{c1}$ is the number of cells in the first section that are switched on, and $i_{n1}$ is the current carried by the current source in a single cell in the first section.

18. The analog-to-digital converter of claim 15, further comprising a transient absorbing circuit, wherein the transient absorbing circuit absorbs a part of the current associated with the input signal of the second section, and releases the part of the current after a predetermined amount of time.

19. The analog-to-digital converter of claim 18, wherein the transient absorbing circuit comprises a transistor for absorbing current, and a Schmitt trigger, wherein current absorbed by the transistor is released if the Schmitt trigger changes state.

20. The analog-to-digital converter of claim 15, further comprising a sample and hold circuit, the sample and hold circuit comprising:
   a first amplifier having a positive terminal and a negative terminal, and a second amplifier having a positive terminal and a negative terminal;
   a first switched capacitor coupled to the negative terminal of the first amplifier, and a second switched capacitor coupled to the negative terminal of the second amplifier;
   wherein when the first amplifier is operated to charge the first switched capacitor to an input voltage value, the second amplifier transfers the voltage across the first switched capacitor or the second switched capacitor to a load, and when the second amplifier is operated to charge the second switched capacitor to the input voltage value, the first amplifier transfers the voltage across the first switched capacitor to the load.

21. A sample and hold circuit for an analog-to-digital converter, comprising:
   a first amplifier having a positive terminal and a negative terminal and a second amplifier having a positive terminal and a negative terminal;
   a first switched capacitor coupled to the negative terminal of the first amplifier and a second switched capacitor coupled to the negative terminal of the second amplifier;
   wherein when the first amplifier is operated to charge the first switched capacitor to an input voltage value, the second amplifier transfers the voltage across the first switched capacitor or the second switched capacitor to a load, and when the second amplifier is operated to charge the second switched capacitor to the input voltage value, the first amplifier transfers the voltage across the first switched capacitor to the load.

* * * * *